(12) United States Patent
Parascandola et al.

(10) Patent No.: US 7,642,158 B2
(45) Date of Patent: Jan. 5, 2010

(54) SEMICONDUCTOR MEMORY DEVICE AND METHOD OF PRODUCTION

(75) Inventors: Stefano Parascandola, Dresden (DE); Roman Knoefler, Fishkill, NY (US); Stephan Riedel, Dresden (DE); Dominik Olligs, Dresden (DE); Torsten Mueller, Dresden (DE); Dirk Caspary, Dresden (DE)

(73) Assignee: Infineon Technologies AG, Munich (DE)

( * ) Notice: Subject to any disclaimer, the term of this patent is extended or adjusted under 35 U.S.C. 154(b) by 371 days.

(21) Appl. No.: 11/241,878

(22) Filed: Sep. 30, 2005

(65) Prior Publication Data

US 2007/0075381 A1    Apr. 5, 2007

(51) Int. Cl.
*H01L 21/336* (2006.01)
*H01L 29/94* (2006.01)

(52) U.S. Cl. .................. 438/257; 438/370; 257/324

(58) Field of Classification Search .......... None
See application file for complete search history.

(56) References Cited

U.S. PATENT DOCUMENTS

| | | | |
|---|---|---|---|
| 6,624,460 B1 | 9/2003 | Huang et al. | |
| 6,686,242 B2 | 2/2004 | Willer et al. | |
| 6,812,096 B2 | 11/2004 | Chen et al. | |
| 6,861,685 B2 * | 3/2005 | Choi | 257/288 |
| 6,914,293 B2 | 7/2005 | Yoshino | |
| 7,323,383 B2 * | 1/2008 | Deppe et al. | 438/259 |
| 2005/0003308 A1 * | 1/2005 | Frohlich et al. | 430/313 |

FOREIGN PATENT DOCUMENTS

| | | |
|---|---|---|
| DE | 101 10 150 A1 | 9/2002 |
| TW | 578273 B | 3/2004 |

OTHER PUBLICATIONS

Eitan, B., et al., "NROM: A Novel Localized Trapping, 2-Bit Nonvolatile Memory Cell," IEEE Electron Device Letters, vol. 21, No. 11, Nov. 2000, pp. 543-545.

* cited by examiner

*Primary Examiner*—Alonzo Chambliss
(74) *Attorney, Agent, or Firm*—Slater & Matsil, L.L.P.

(57) ABSTRACT

The bit lines are produced by an implantation of a dopant by means of a sacrificial hard mask layer, which is later replaced with the gate electrodes formed of polysilicon in the memory cell array. Striplike areas of the memory cell array, which run transversely to the bit lines, are reserved by a blocking layer to be occupied by the bit line contacts. In these areas, the hard mask is used to form contact holes, which are self-aligned with the implanted buried bit lines. Between the blocked areas, the word lines are arranged normally to the bit lines.

25 Claims, 6 Drawing Sheets

SEMICONDUCTOR MEMORY DEVICE AND METHOD OF PRODUCTION

TECHNICAL FIELD

The present invention concerns semiconductor memory devices comprising buried bit lines and electric contacts on upper surfaces of the bit lines.

BACKGROUND

U.S. Pat. No. 6,686,242 and German counterpart patent application DE 10110150 A1, both of which are incorporated herein by reference, describe a method of producing metalized buried bit lines in memory cell arrays. Bit line contacts are arranged between gate electrodes of polysilicon. Word lines are applied transversely to the buried bit lines and comprise a further polysilicon layer. When the word lines are structured, separate gate electrodes are formed of first polysilicon strips. This method does not offer the possibility to apply self-aligned bit line contacts. An insufficient alignment of the contacts to the buried bit lines may cause short-circuits and thus fatally impede the device performance.

Non-volatile memory cells that are electrically programmable and erasable can be realized as charge-trapping memory cells comprising a memory layer sequence of dielectric materials. A memory layer that is suitable for charge-trapping is arranged between upper and lower boundary layers of dielectric material having a larger energy band gap than the memory layer. The memory layer sequence is arranged between a channel region within a semiconductor body and a gate electrode provided to control the channel by means of an applied electric voltage.

In the programming process, charge carriers in the channel region are induced to penetrate the lower boundary layer and are trapped in the memory layer. The trapped charge carriers change the threshold voltage of the cell transistor structure. Different programming states can be read by applying the appropriate reading voltages. Examples of charge-trapping memory cells are the SONOS memory cells, in which the boundary layers are oxide and the memory layer is a nitride of the semiconductor material, usually silicon.

A publication by B. Eitan et al., "NROM: a Novel Localized Trapping, 2-Bit Nonvolatile Memory Cell" in IEEE Electron Device Letters, volume 21, pages 543 to 545 (2000), which is incorporated herein by reference, describes a charge-trapping memory cell with a memory layer sequence of oxide, nitride and oxide, which is especially adapted to be operated with a reading voltage that is reverse to the programming voltage (reverse read). NROM cells can be programmed by channel hot electrons (CHE), which are accelerated from source to drain to gain enough energy to penetrate the lower boundary layer, and can be erased by the injection of hot holes from the channel region or by Fowler-Nordheim tunneling. The oxide-nitride-oxide layer sequence is designed to avoid direct tunneling of charge-carriers and to guarantee the vertical retention of the trapped charge carriers. The oxide layers are specified to have a thickness of more than 5 nm.

The memory layer can be substituted with another dielectric material, provided the energy band gap is smaller than the energy band gap of the boundary layers. The difference in the energy band gaps should be as great as possible to secure a good charge carrier confinement and thus good data retention. When using silicon dioxide as boundary layers, the memory layer may be tantalum oxide, cadmium silicate, titanium oxide, zirconium oxide or aluminum oxide. Also intrinsically conducting (non-doped) silicon may be used as the material of the memory layer.

SUMMARY OF THE INVENTION

The present invention enables the production of buried bit lines with self-aligned contacts between groups of word lines that are arranged above the bit lines. The bit lines are produced by an implantation of a dopant without making use of a polysilicon mask, but using a sacrificial hard mask layer instead, which is later replaced with the gate electrodes formed of polysilicon in the memory cell array. Striplike areas of the memory cell array, which run transversely to the bit lines, are reserved to be occupied by the bit line contacts. In these areas, the hard mask is used to form contact holes, which are self-aligned with the implanted buried bit lines.

In a first aspect, this invention provides semiconductor memory devices that include a semiconductor body such as a substrate with a main surface. A plurality of bit lines are formed as parallel doped strips in the substrate at the main surface. A plurality of word lines are arranged in groups above the bit lines and run parallel to one another transversely to the bit lines. A plurality of portions of a hard mask are arranged along striplike areas of the main surface that are located transversely to the bit lines and between groups of word lines. Pluralities of contact holes are located between these portions of the hard mask and above the bit lines.

In a second aspect, this invention provides semiconductor memory devices that include a substrate having a main surface. A plurality of buried bit lines are formed as doped regions at the main surface. A plurality of word lines are arranged in groups transversely above the bit lines. A plurality of portions of a hard mask having sidewalls are arranged along striplike areas of the main surface between groups of word lines. Pluralities of contact holes are arranged above the bit lines between the portions of the hard mask. Areas of the sidewalls of the hard mask form lateral boundaries of the contact holes.

In a third aspect, this invention provides methods for producing semiconductor memory devices. A substrate with a main surface is provided. A hard mask layer is applied and structured into portions forming a hard mask. A dopant is implanted into the main surface to form doped regions that are provided as bit lines and are arranged along a first direction in striplike fashion parallel to one another. A blocking layer is formed of a material that is selectively etchable with respect to the hard mask. The blocking layer is structured in striplike portions extending along a second direction that is transverse to the first direction. Contact holes are etched into the blocking layer.

In a fourth aspect, this invention provides methods for producing semiconductor memory devices, by which a substrate with a main surface is provided with a hard mask layer, which is structured into striplike portions that extend parallel at a distance from one another, forming a hard mask. Striplike doped regions provided as bit lines are formed by an implantation of a dopant. A blocking layer is formed of a material that is selectively etchable with respect to the hard mask. The blocking layer is structured in striplike portions transversely to the bit lines. Contact holes are formed in the blocking layer, which are, at least partially, laterally bounded by portions of the hard mask. Portions of the hard mask that are not covered by the blocking layer are removed.

In a fifth aspect, this invention provides methods for producing semiconductor memory devices, by which a substrate with a main surface is provided. A hard mask is applied that includes striplike portions that are arranged parallel at a distance from one another and have sidewalls. A spacer layer is applied and etched to form spacers at the sidewalls. An implantation of a dopant is performed between the spacers into the main surface to form doped regions provided as bit lines. A blocking layer formed of a material that is selectively etchable with respect to the material of the hard mask is applied over the hard mask. The blocking layer is structured into striplike portions running transversely to the striplike portions of the hard mask. Portions of the hard mask that are not covered by the blocking layer are removed. Contact holes are formed in the blocking layer above the bit lines so that the contact holes are at least partially laterally bounded by the hard mask.

In a sixth aspect, this invention provides methods for producing semiconductor memory devices, by which a substrate with a main surface is provided. A lower boundary layer is applied on the main surface. A memory layer of a dielectric material that is suitable for charge-trapping is applied on the lower boundary layer. An upper boundary layer is applied on the memory layer. A hard mask that includes striplike portions that are arranged parallel at a distance from one another and have sidewalls is applied on the upper boundary layer. The upper boundary layer and the memory layer are structured according to the striplike portions of the hard mask. A spacer layer is applied and etched to form spacers at the sidewalls of the hard mask. A dopant is implanted between the spacers into the main surface to form doped regions provided as bit lines. A blocking layer is applied over the hard mask. The blocking layer is formed of a material that is selectively etchable with respect to the hard mask and is structured into striplike portions running transversely to the striplike portions of the hard mask. Portions of the hard mask that are not covered by the blocking layer are removed. Contact holes are formed in the blocking layer above the bit lines so that the contact holes are, at least partially, laterally bounded by the sidewalls of the hard mask.

These and other features and advantages of the invention will become apparent from the following brief description of the drawings, detailed description and appended claims and drawings.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
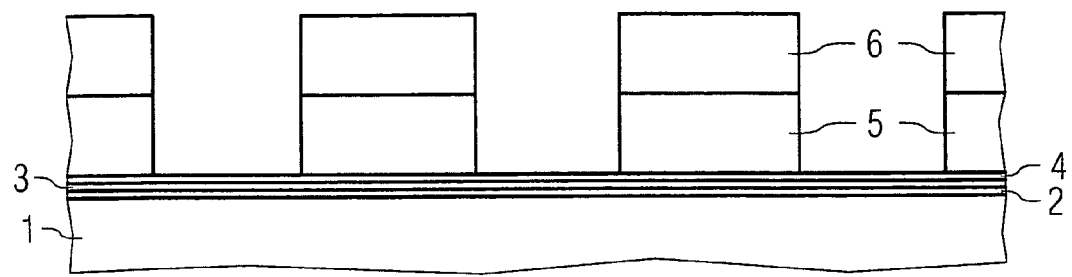
FIG. 1 shows a cross-section of an intermediate product after the structuring of the hard mask.

The following list of reference symbols can be used in conjunction with the figures:
1 substrate
2 lower boundary layer
3 memory layer
4 upper boundary layer
5 hard mask
6 resist
7 pocket implant
8 spacer layer
9 spacer
10 bit line
11 blocking layer
12 further mask
13 contact hole
14 word line

DETAILED DESCRIPTION OF ILLUSTRATIVE EMBODIMENTS

Embodiments of the semiconductor memory device and preferred methods of production are now described for an example of an especially preferred production method in connection with the figures. FIG. 1 is a cross-section that shows a section of an intermediate product of an embodiment of the inventive semiconductor memory device after the formation of a hard mask. A body 1 of a semiconductor material, preferably silicon, having a main surface is provided. This semiconductor body 1 can be a substrate or a layer over a substrate (e.g., an SOI wafer).

The described example comprises a memory layer sequence that is provided for charge-trapping. The memory layer sequence has a lower boundary layer 2 of a suitable dielectric material, which is applied to the main substrate surface. A memory layer 3 of a dielectric material that is suitable for charge-trapping is applied onto the lower boundary layer 2. An upper boundary layer 4, which may be formed of the same material as the lower boundary layer 2, is applied onto the memory layer 3. This layer sequence can especially be a standard oxide-nitride-oxide layer sequence; it can also be any other dielectric layer sequence that is appropriate for charge-trapping. The memory layer sequence can be substituted with another storage means.

A hard mask layer 5, preferably of silicon nitride, is applied and structured by means of a mask technique that preferably uses a resist 6, which is structured by photolithography. The hard mask 5 comprises striplike portions that are arranged parallel at a distance from one another with constant lateral dimension.

Figure 2:
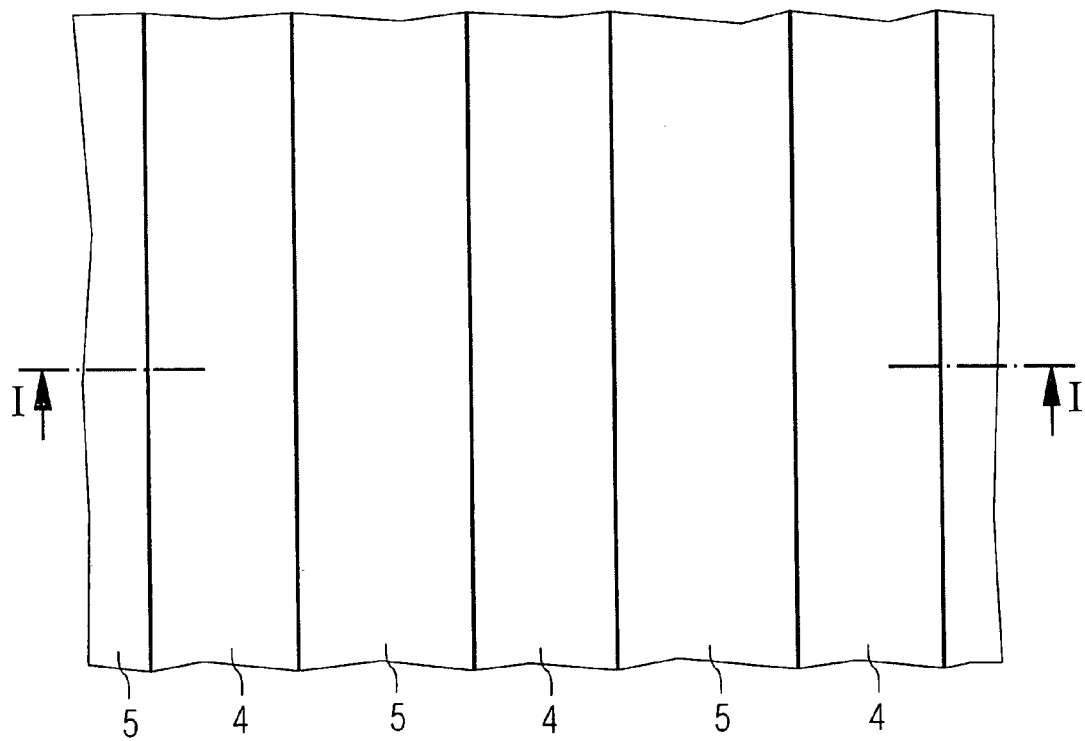
FIG. 2 shows a plan view onto the intermediate product according to FIG. 1.

FIG. 2 shows a plan view onto the intermediate product according to FIG. 1 after the removal of the resist 6. The location of the cross-section of FIG. 1 is indicated in FIG. 2 by the broken line. Between the striplike portions of the hard mask 5, the striplike areas of the upper boundary layer 4 that are left free from the hard mask 5 are also shown in FIG. 2.

Figure 3:
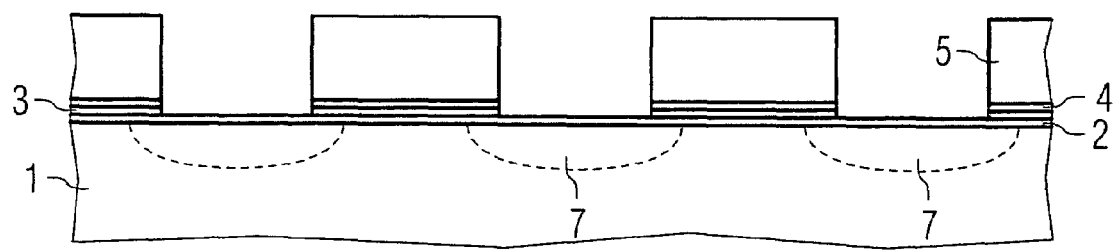
FIG. 3 shows the cross-section according to FIG. 1 after a pocket implantation.

FIG. 3 shows the cross-section according to FIG. 1 after an implantation of pocket implants. If a memory layer sequence of oxide, nitride and oxide is provided, the upper boundary layer 4 and the memory layer 3 are preferably removed in the openings between the striplike portions of the hard mask 5. The bottom oxide of the lower boundary layer 2 is preferably left on the main surface of the substrate 1. Then a pocket implant 7, indicated by broken lines in FIG. 3, can be introduced through the openings of the hard mask 5. The pocket implant can comprise, for example, a p-dopant, especially boron atoms. It is provided for the buried bit lines that are produced in further method steps. Apart from the removal of the upper boundary layer and the memory layer, the plan view onto the intermediate product according to FIG. 3 is essentially the same as the plan view shown in FIG. 2.

Figure 4:
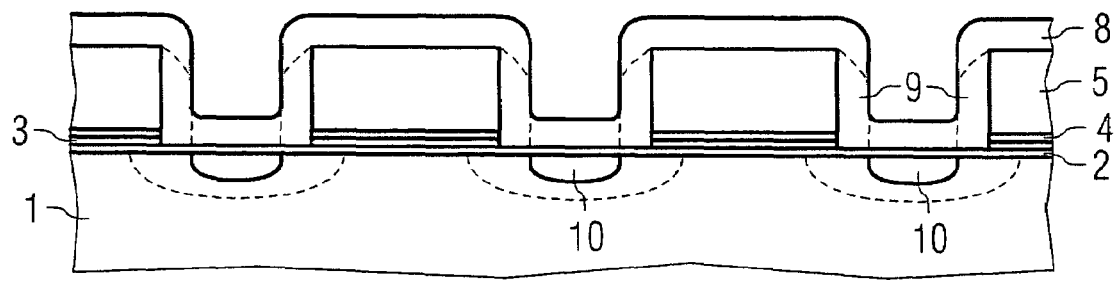
FIG. 4 shows the cross-section according to FIG. 3 after the application of a spacer layer.

FIG. 4 shows the cross-section according to FIG. 3 after the application of a spacer layer 8, which is preferably oxide if the hard mask 5 is nitride. The spacer layer 8 is preferably formed of a material that is selectively etchable with respect to the material of the hard mask 5. The spacer layer 8 is conformally applied and then anisotropically etched back to form the spacers 9 on the sidewalls of the hard mask 5, as indicated by broken lines in FIG. 4. After the formation of the spacers 9, buried bit lines 10 are formed by an implantation of a suitable dopant in the areas of the main surface between the spacers 9. N-doped bit lines, for example, can be produced by an implantation of arsenic atoms.

Figure 5:
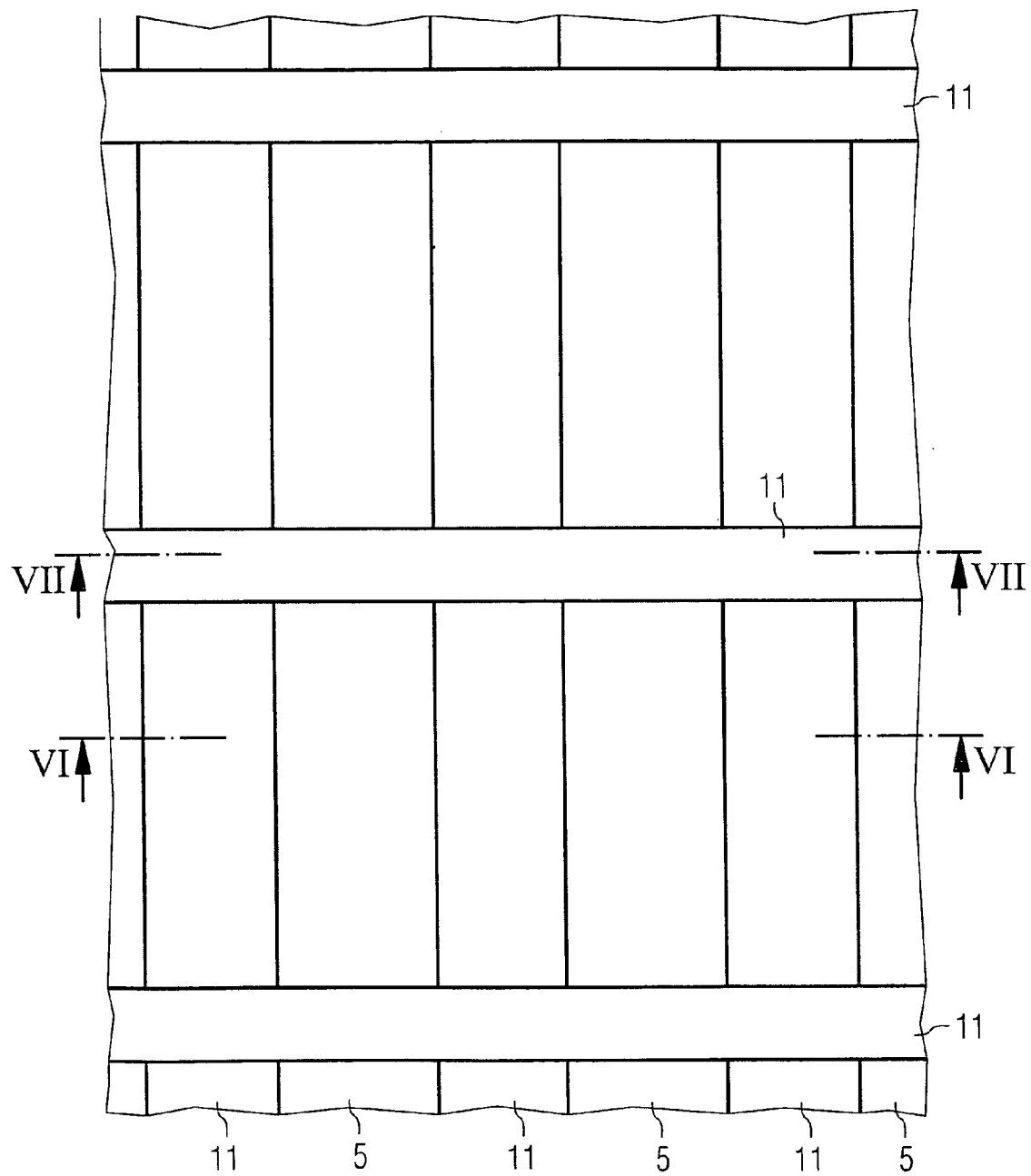
FIG. 5 shows a plan view according to FIG. 2 after the application of a blocking layer.

FIG. 5 shows the plan view according to FIG. 2 after the subsequent application of a blocking layer 11, which is structured into striplike portions running transversely to the bit lines. The blocking layer 11 is preferably oxide. The striplike portions are formed in an area that is provided for the bit line contacts. The striplike portions of the blocking layer 11 can be structured in a usual way by means of a further resist layer and photolithography. Preferably, the blocking layer 11 is not completely removed between the striplike portions of the hard mask 5. This is also indicated in FIG. 5 by the reference numeral 11. The cross-sections indicated in FIG. 5 are shown in FIGS. 6 and 7.

Figure 6:
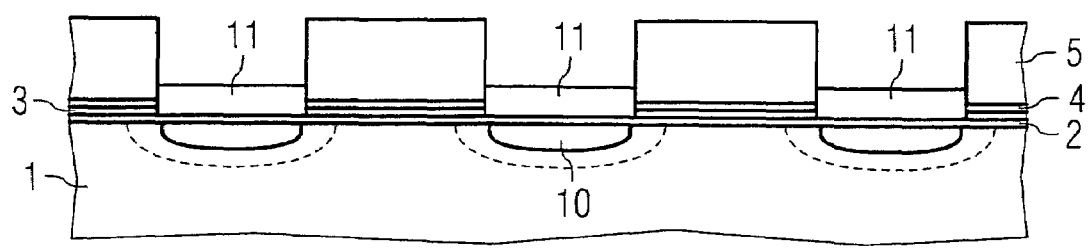
FIG. 6 shows a cross-section according to FIG. 4 between striplike portions of the blocking layer.

FIG. 6 shows the cross-section between the striplike portions of the blocking layer 11. It is essentially identical to the cross-section of FIG. 3, with the difference that residual parts of the blocking layer 11 have been left on the lower boundary layer 2 between the portions of the hard mask; however, the blocking layer 11 can completely be removed in these areas instead. In the areas between the striplike portions of the blocking layer 11, the spacers 9, which can be formed of the same material as the blocking layer, especially oxide, are preferably removed.

Figure 7:
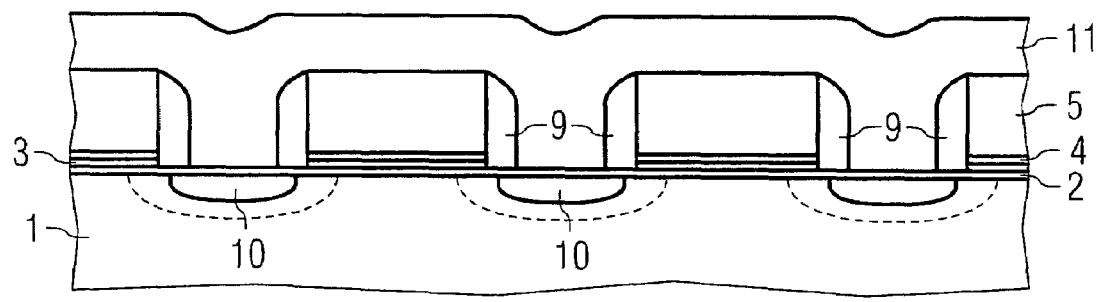
FIG. 7 shows a cross-section according to FIG. 4 through the striplike portions of the blocking layer.

FIG. 7 shows the cross-section through one of the striplike portions of the blocking layer 11. Thus, beneath the portions of the blocking layer, the spacers 9 are left on the sidewalls of the portions of the hard mask 5.

Figure 8:
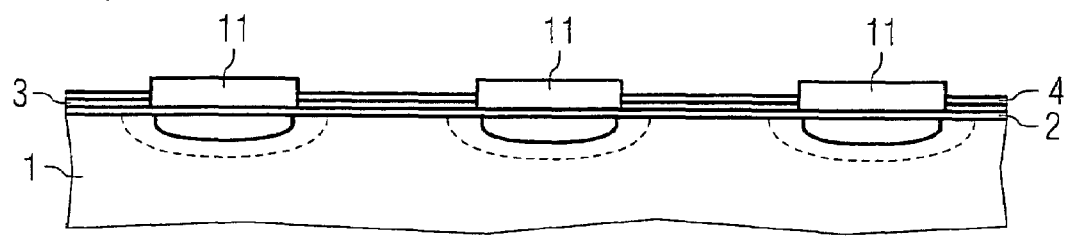
FIG. 8 shows the cross-section according to FIG. 6 after the removal of the hard mask.

FIG. 8 shows the cross-section according to FIG. 6 after the selective removal of the hard mask 5 with respect to the other layers. A hard mask formed of nitride is preferably removed selectively to the oxide of the blocking layer 11 and the upper boundary layer 4 by a combination of dry and wet etches, which is known per se. FIG. 8 also shows that the residual thin layers of the blocking layer 11 protect the material of the memory layer 3, which can be nitride. The lateral dimension of the buried bit lines can extend more or less beneath the remaining parts of the memory layer 3, depending on further annealing or diffusion steps.

Figure 9:
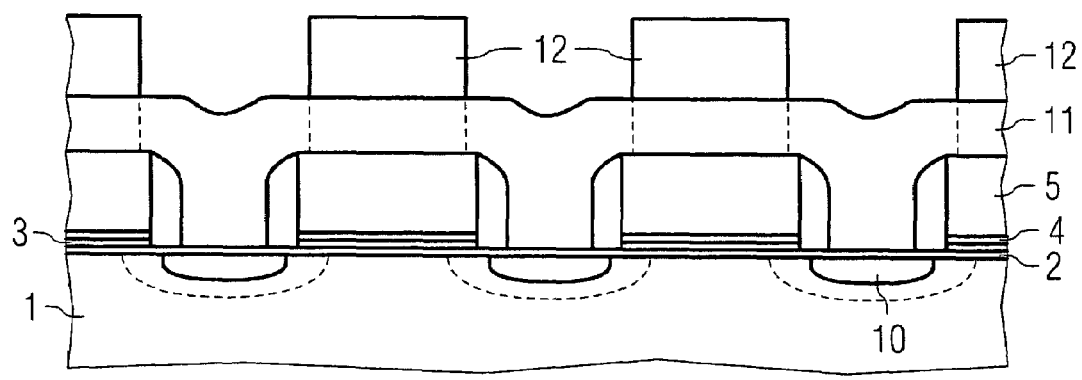
FIG. 9 shows the cross-section according to FIG. 7 after the application of a further mask.

FIG. 9 shows the cross-section according to FIG. 7 after the application of a further mask 12, which can be a resist mask or a hard mask and is preferably a resist layer that has been structured by photolithography. The further mask 12 is used to remove the blocking layer 11 within the areas that are provided for the contact holes. The lateral boundaries of the contact holes that are to be formed are indicated by vertical broken lines in FIG. 9. It can also be seen from FIG. 9 that the openings of the further mask 12 need not be adapted exactly to the lateral dimensions of the contact holes, since the residual portions of the hard mask 5 render the creation of the contact holes self-aligned.

Figure 10:
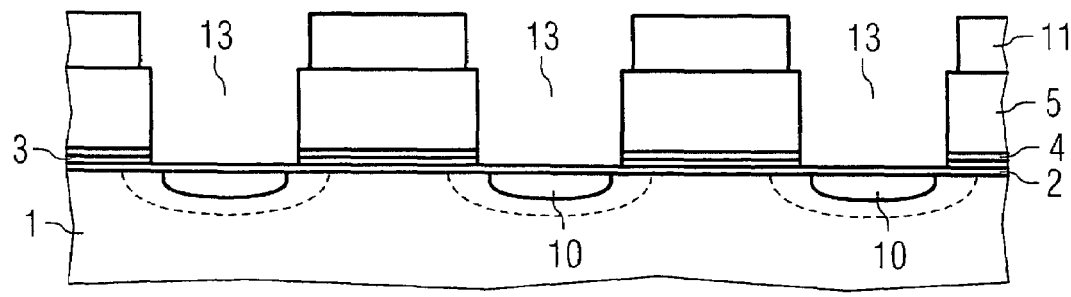
FIG. 10 shows the cross-section according to FIG. 9 after the formation of holes.

FIG. 10 shows the cross-section according to FIG. 9 after the formation of the contact holes 13 and the removal of the further mask 12. Remaining parts of the blocking layer 11 are left on the remaining portions of the hard mask 5. In further method steps, the contact holes 13 can be filled with electrically conductive material to contact the buried bit lines.

Figure 11:
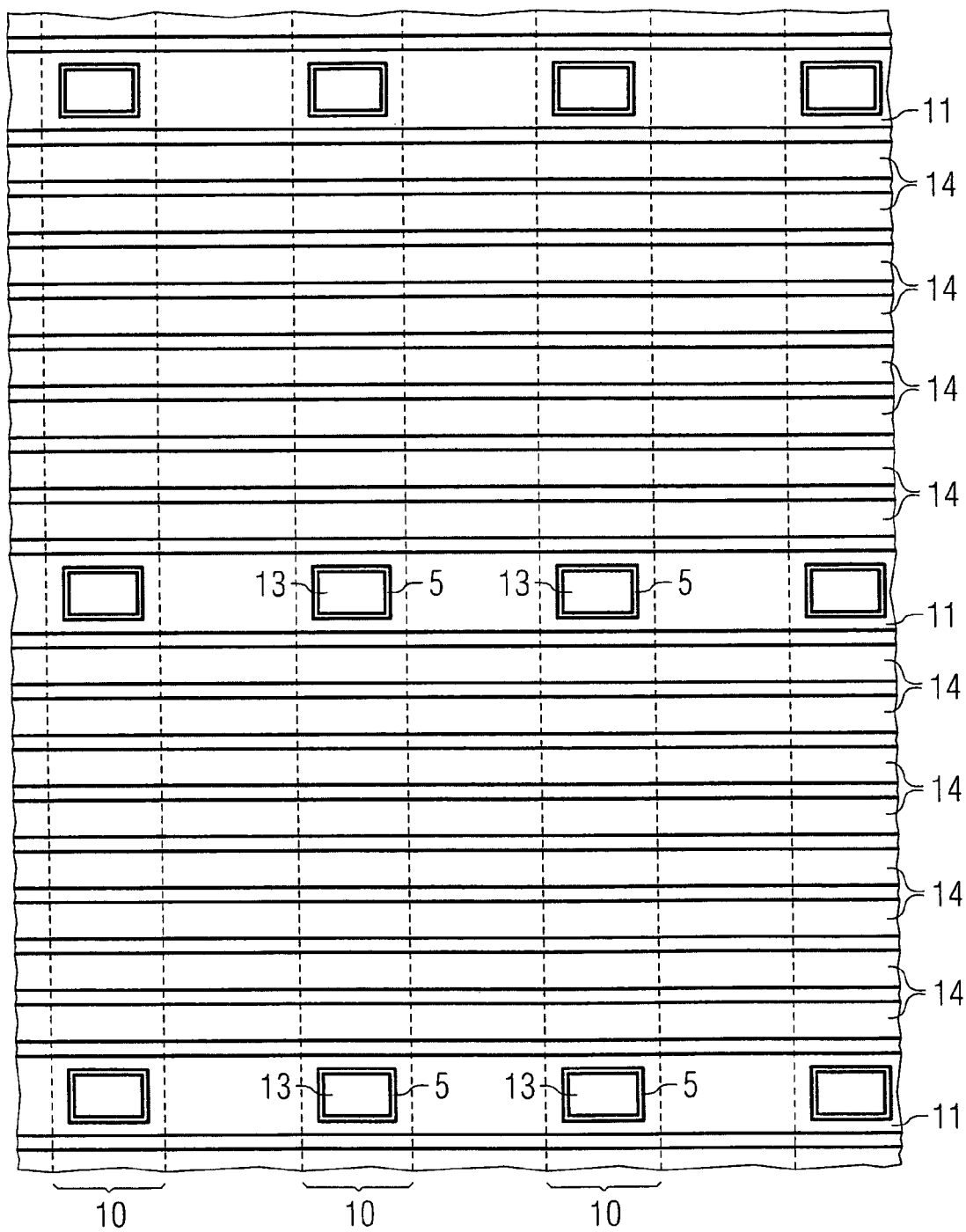
FIG. 11 shows the plan view according to FIG. 5 after the formation of the holes.

FIG. 11 shows the plan view according to FIG. 5 after the formation of the contact holes 13 and the application of word lines 14, which run transversely to the bit lines and are arranged in groups between two subsequent striplike portions of the blocking layer 11. The concealed contours of the lateral boundaries of the bit lines 10 are indicated by broken lines and, in this example, extend laterally beneath the residual portions of the hard mask 5 and the remaining parts of the memory layer 3. As already mentioned, the exact position of the lateral boundaries of the bit lines depends on further method steps and can vary between different embodiments. Upper lateral edges of the hard mask 5 that are not covered by the remaining part of the blocking layer 11 are shown within the contact holes 13. The arrangement shown in FIG. 11 is not drawn to scale; the lateral dimensions of the word lines 14 and the buried bit lines 10 can deviate from the dimensions shown in FIG. 11. Also the number of word lines that are arranged between two subsequent striplike portions of the blocking layer 11 can vary.

Due to the selective etching of the contact holes with respect to the material of the hard mask 5, and due to the application of the hard mask 5 in the implantation step of the buried bit lines, the contact holes 13 are self-aligned with respect to the bit lines 10 in the direction that is normal to the longitudinal extension of the bit lines. If a totally self-aligned arrangement of the contact holes 13 in all lateral directions is desired, the spaces between the striplike portions of the blocking layer 11 can be filled with a further layer, which is formed of a material to which the material of the blocking layer 11 can be etched selectively. This further layer can be nitride, for example. In this case, the openings in the further mask 12 are formed in such a manner that they overlap the area that is occupied by the further layer in the longitudinal direction of the bit lines 10. The further layer then forms lateral boundaries of the etched contact holes. Thus, the lateral dimension of the contact holes 13 in the longitudinal direction of the bit lines can be defined by the lateral dimension of the striplike portions of the blocking layer 11. The further layer can then be removed, and the word lines 14 be applied.

Although the present invention and its advantages have been described in detail, it should be understood that various changes, substitutions and alterations can be made herein without departing from the spirit and scope of the invention as defined by the appended claims.

What is claimed is:

1. A method for producing a semiconductor memory device, the method comprising:
    providing a semiconductor body with a main surface;
    applying a hard mask layer over the semiconductor body;
    structuring said hard mask layer into portions to form a hard mask;
    forming bit lines by performing an implantation of a dopant into said main surface to form doped regions in said semiconductor body, said regions arranged along a first direction in striplike fashion parallel to one another;
    applying a blocking layer formed of a material that is selectively etchable with respect to the hard mask;

structuring said blocking layer in striplike portions extending along a second direction that is transverse to said first direction; and forming contact holes in said blocking layer, the contact holes being bounded by said portions of said hard mask.

2. The method according to claim 1, wherein said hard mask is formed in striplike portions that extend parallel at a distance from one another; the method comprising:
using said striplike portions of said blocking layer as a mask to remove portions of said hard mask that are not covered by the blocking layer.

3. The method according to claim 2, further comprising:
arranging word lines along said second direction in areas of said main surface that are located between said striplike portions of said blocking layer.

4. The method according to claim 2, further comprising:
arranging a further layer of a material that is suitable for a hard mask in areas of said main surface that are located between said striplike portions of said blocking layer; and
forming said contact holes so that they are bounded in said first direction by said further layer and in said second direction by said hard mask.

5. The method according to claim 1, wherein said hard mask comprises a nitride hard mask.

6. The method according to claim 1, wherein said blocking layer comprises oxide.

7. The method according to claim 1, further comprising, before applying said hard mask layer, applying a layer sequence of dielectric materials to said main surface, said layer sequence being provided as a storage region and comprising at least a lower boundary layer, a memory layer suitable for charge-trapping, and an upper boundary layer.

8. A method for producing a semiconductor memory device, the method comprising:
providing a semiconductor body with a main surface;
applying a hard mask layer over the semiconductor body;
forming a hard mask by structuring said hard mask layer into portions;
forming bit lines arranged along a first direction in striplike fashion, the bit lines being formed by an implantation of a dopant into said main surface;
applying a blocking layer formed of a material that is selectively etchable with respect to the hard mask;
structuring said blocking layer in striplike portions extending along a second direction that is transverse to said first direction;
forming contact holes in said blocking layer, the contact holes being, at least partially, laterally bounded by said portions of said hard mask;
forming said hard mask in striplike portions that extend parallel at a distance from one another; and
removing portions of said hard mask that are not covered by said blocking layer.

9. A method for producing semiconductor memory devices, comprising:
providing a semiconductor body with a main surface;
applying a hard mask over the semiconductor body, the hard mask comprising striplike portions that are arranged parallel at a distance from one another and have sidewalls;
applying a spacer layer over the semiconductor body;
etching said spacer layer to form spacers at said sidewalls;
performing an implantation of a dopant between said spacers into said main surface to form doped regions provided as bit lines;
applying a blocking layer over said hard mask, said blocking layer being formed of a material that is selectively etchable with respect to said hard mask;
structuring said blocking layer into striplike portions running transversely to said striplike portions of said hard mask;
removing portions of said hard mask that are not covered by said blocking layer; and
forming contact holes in said blocking layer above said bit lines, said contact holes being, at least partially, laterally bounded by said hard mask.

10. The method according to claim 9, further comprising, before applying said hard mask, applying a lower boundary layer on said main surface, a memory layer of a dielectric material that is suitable for charge-trapping on said lower boundary layer, and an upper boundary layer on said memory layer.

11. The method according to claim 10, further comprising, structuring said upper boundary layer and said memory layer according to said striplike portions of said hard mask.

12. The method according to claim 10, wherein applying said hard mask comprises applying a nitride and wherein applying said blocking layer comprises applying an oxide.

13. The method according to claim 10, further comprising, arranging word lines between said striplike portions of said blocking layer, said word lines running transversely to said bit lines.

14. The method according to claim 10, further comprising:
applying a further hard mask between said striplike portions of said blocking layer; and
forming said contact holes to be bounded by said hard mask and said further hard mask.

15. The method according to claim 10, further comprising, performing a pocket implantation between said striplike portions of said hard mask before the application of said spacer layer.

16. A method for producing a semiconductor memory device, the method comprising:
providing a semiconductor body with a main surface;
applying a lower boundary layer over said main surface;
applying a memory layer of a dielectric material that is suitable for charge-trapping on said lower boundary layer;
applying an upper boundary layer on said memory layer;
applying a hard mask over said upper boundary layer, said hard mask comprising striplike portions that are arranged parallel at a distance from one another and have sidewalls;
structuring said upper boundary layer and said memory layer according to said striplike portions of said hard mask;
applying a spacer layer;
etching said spacer layer to form spacers at said sidewalls;
performing an implantation of a dopant between said spacers into said main surface to form doped regions provided as bit lines;
applying a blocking layer over said hard mask, said blocking layer being formed of a material that is selectively etchable with respect to said hard mask;
structuring said blocking layer into striplike portions running transversely to said striplike portions of said hard mask;
removing portions of said hard mask that are not covered by said blocking layer; and
forming contact holes in said blocking layer above said bit lines, said contact holes being, at least partially, laterally bounded by said hard mask.

17. The method according to claim 16, wherein applying said hard mask comprises applying a nitride and wherein applying said blocking layer comprises applying an oxide.

18. The method according to claim 16, further comprising, arranging word lines between said striplike portions of said blocking layer, said word lines running transversely to said bit lines.

19. The method according to claim 16, further comprising, applying a further hard mask between said striplike portions of said blocking layer, wherein said contact holes are bounded by said hard mask and said further hard mask.

20. The method according to claim 16, further comprising, performing a pocket implantation between said striplike portions of said hard mask before the application of said spacer layer.

21. A method for producing a semiconductor memory device, the method comprising:
   forming a plurality of bit lines in a main surface of a semiconductor body, the bit lines being formed as parallel doped strips;
   forming a plurality of word lines arranged in groups above said bit lines, the word lines running parallel to one another transversely to said bit lines;
   forming a plurality of portions of a hard mask along striplike areas of the main surface that are located transversely to said bit lines and between groups of said word lines; and
   forming pluralities of contact holes in said strip like areas between said portions, said contact holes being arranged above said bit lines.

22. The method according to claim 21, wherein forming a plurality of portions of a hard mask comprises forming portions of a nitride hard mask.

23. The method according to claim 21, wherein said portions of said hard mask have sidewalls, and areas of said sidewalls form lateral boundaries of said contact holes.

24. The method according to claim 23, wherein forming a plurality of portions of a hard mask comprises forming portions of a nitride hard mask.

25. The method according to claim 23, further comprising forming a dielectric material between said portions of said hard mask thereby forming further lateral boundaries of said contact holes.

* * * * *